(12) United States Patent
Ortner et al.

(10) Patent No.: US 11,640,908 B2
(45) Date of Patent: May 2, 2023

(54) METHOD OF IMPLANTING AN IMPLANT SPECIES INTO A SUBSTRATE AT DIFFERENT DEPTHS

(71) Applicant: Infineon Technologies AG, Neubiberg (DE)

(72) Inventors: Joerg Ortner, Drobollach (AT); Marcel Heller, Stolpen (DE); Dieter Kaiser, Dresden (DE); Nicolo Morgana, Dresden (DE); Jens Schneider, Moritzburg OT Friedewald (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/877,855

(22) Filed: May 19, 2020

(65) Prior Publication Data

US 2020/0373163 A1    Nov. 26, 2020

(30) Foreign Application Priority Data

May 20, 2019 (EP) .................................. 19175280

(51) Int. Cl.
*H01L 21/266* (2006.01)
*H01L 21/265* (2006.01)
*H01L 29/78* (2006.01)

(52) U.S. Cl.
CPC ...... *H01L 21/266* (2013.01); *H01L 21/26513* (2013.01); *H01L 21/26586* (2013.01); *H01L 29/7816* (2013.01); *H01L 29/7835* (2013.01)

(58) Field of Classification Search
CPC ......... H01L 21/0465–047; H01L 21/265–266; H01L 29/7835; H01L 29/78624; H01L 21/26586; H01L 21/2253
See application file for complete search history.

(56) References Cited

U.S. PATENT DOCUMENTS

| | | | | |
|---|---|---|---|---|
| 4,596,605 A | * | 6/1986 | Nishizawa | ........ H01L 29/66416 |
| | | | | 438/528 |
| 5,300,454 A | | 4/1994 | Taft et al. | |
| 6,320,236 B1 | * | 11/2001 | Krivokapic | ....... H01L 21/26586 |
| | | | | 257/E21.345 |
| 6,399,448 B1 | * | 6/2002 | Mukhopadhyay | .......................... |
| | | | | H01L 21/823462 |
| | | | | 438/528 |

(Continued)

FOREIGN PATENT DOCUMENTS

DE    10325011 A1    1/2005

*Primary Examiner* — Maliheh Malek
(74) *Attorney, Agent, or Firm* — Murphy, Bilak & Homiller, PLLC (57) ABSTRACT

A method of implanting an implant species into a substrate at different depths is described. The method includes forming an implant mask over the substrate. The implant mask includes a first implant zone designed as an opening and a second implant zone designed as a block array. The implant species is implanted through the implant mask under an implant angle tilted against a block plane, such that a first implant area is formed by the implant species at a first depth in the substrate beneath the first implant zone and a second implant area is formed by the implant species at a second depth in the substrate beneath the second implant zone. The first depth is greater than the second depth.

16 Claims, 5 Drawing Sheets

(56) References Cited

U.S. PATENT DOCUMENTS

| | | | |
|---|---|---|---|
| 6,569,606 B1* | 5/2003 | Wu | H01L 21/0274 430/311 |
| 6,593,627 B2* | 7/2003 | Egashira | H01L 21/76243 257/350 |
| 6,876,037 B2* | 4/2005 | Wei | H01L 29/66772 257/344 |
| 6,934,050 B2* | 8/2005 | Merrill | H04N 5/3696 348/E3.018 |
| 7,141,457 B2* | 11/2006 | Ieong | H01L 21/2007 438/149 |
| 7,141,459 B2* | 11/2006 | Yang | H01L 21/7624 438/154 |
| 7,268,023 B2* | 9/2007 | Ramaswamy | H01L 21/76283 257/E21.415 |
| 7,521,760 B2* | 4/2009 | Joshi | H01L 21/84 257/1 |
| 7,705,387 B2* | 4/2010 | Ito | G11C 16/0483 365/185.11 |
| 7,804,068 B2* | 9/2010 | Notte, IV | H01J 49/142 250/306 |
| 7,968,944 B2* | 6/2011 | Joshi | H01L 21/84 257/350 |
| 7,977,186 B2* | 7/2011 | Ito | H01L 27/11524 438/257 |
| 8,183,666 B2* | 5/2012 | Schulze | H01L 29/7802 257/611 |
| 8,653,578 B2* | 2/2014 | Lee | H01L 27/11521 257/315 |
| 8,785,306 B2* | 7/2014 | Guan | H01L 29/7802 438/495 |
| 9,431,253 B1* | 8/2016 | Tan | H01L 29/788 |
| 9,711,357 B1* | 7/2017 | Weber | H01L 23/544 |
| 9,768,028 B1* | 9/2017 | Feilchenfeld | H01L 21/26513 |
| 9,954,093 B2* | 4/2018 | Weber | H01L 29/157 |
| 10,854,770 B2* | 12/2020 | Na | H01L 31/02027 |
| 10,972,688 B2* | 4/2021 | Rosmeulen | H01L 27/14612 |
| 11,164,746 B2* | 11/2021 | Chen | H01L 21/26533 |
| 2002/0025632 A1* | 2/2002 | Hayashi | H01L 21/823481 438/275 |
| 2002/0142507 A1* | 10/2002 | Egashira | H01L 27/1203 438/48 |
| 2002/0158303 A1* | 10/2002 | Kuroi | H01L 21/823481 257/E21.546 |
| 2003/0104681 A1* | 6/2003 | Davari | H01L 21/76243 438/480 |
| 2003/0207543 A1* | 11/2003 | Sailing | H01L 29/1079 257/E21.336 |
| 2003/0214595 A1* | 11/2003 | Mabuchi | H01L 27/14643 348/294 |
| 2004/0164304 A1* | 8/2004 | Magri | H01L 29/66719 257/73 |
| 2006/0180863 A1* | 8/2006 | Chen | H01L 21/823857 257/E21.639 |
| 2006/0208314 A1* | 9/2006 | Kaneko | H01L 29/7813 257/330 |
| 2007/0190739 A1* | 8/2007 | Zundel | H01L 21/76243 438/423 |
| 2007/0224748 A1 | 9/2007 | Rohrer et al. | |
| 2007/0235806 A1* | 10/2007 | Joshi | H01L 27/1203 257/350 |
| 2007/0249170 A1* | 10/2007 | Kewley | H01L 21/2815 438/717 |
| 2008/0067587 A1* | 3/2008 | Gossner | H01L 29/7436 257/336 |
| 2009/0130852 A1* | 5/2009 | Kewley | H01L 21/2815 438/694 |
| 2009/0170033 A1* | 7/2009 | Jung | H01L 21/32139 430/319 |
| 2009/0189234 A1* | 7/2009 | Mabuchi | H04N 5/3575 257/E31.093 |
| 2009/0197382 A1* | 8/2009 | Anderson | H01L 21/26513 438/283 |
| 2010/0159681 A1* | 6/2010 | Tsumura | H01L 21/2652 438/527 |
| 2011/0215402 A1* | 9/2011 | Lee | H01L 29/1095 257/E29.256 |
| 2014/0113420 A1* | 4/2014 | Sargunas | H01L 27/0207 438/231 |
| 2014/0191338 A1* | 7/2014 | Nii | G11C 11/412 257/401 |
| 2014/0231970 A1* | 8/2014 | Schneider | H01L 29/7835 430/5 |
| 2015/0031210 A1* | 1/2015 | Ban | H01L 21/0337 438/703 |
| 2015/0091083 A1* | 4/2015 | Poelzl | H01L 21/283 438/270 |
| 2015/0255290 A1 | 9/2015 | Masuoka et al. | |
| 2015/0357406 A1* | 12/2015 | Guan | H01L 21/2253 257/493 |
| 2016/0225627 A1* | 8/2016 | Chou | H01L 27/11568 |
| 2016/0260731 A1* | 9/2016 | Nagai | H01L 21/76805 |
| 2018/0006147 A1* | 1/2018 | Weber | H01L 21/26586 |
| 2018/0017492 A1* | 1/2018 | Kato | G01N 21/6454 |
| 2018/0019301 A1* | 1/2018 | Yasuda | H01L 29/0688 |
| 2018/0053824 A1* | 2/2018 | Wang | H01L 21/76224 |
| 2018/0130668 A1* | 5/2018 | Liu | H01L 21/31116 |
| 2019/0019679 A1* | 1/2019 | Iguchi | H01L 29/0696 |
| 2019/0081251 A1* | 3/2019 | Obana | H01L 51/0074 |
| 2019/0131447 A1* | 5/2019 | Elpelt | H01L 21/047 |
| 2020/0028019 A1* | 1/2020 | Takimoto | H01L 31/02027 |
| 2020/0135896 A1* | 4/2020 | Grote | H01L 29/0878 |
| 2020/0144323 A1* | 5/2020 | Liu | H01L 27/14687 |
| 2020/0192133 A1* | 6/2020 | Wang | G02F 1/092 |
| 2020/0280010 A1* | 9/2020 | Jiang | H01L 27/322 |
| 2020/0309597 A1* | 10/2020 | Koelper | G01J 3/10 |
| 2020/0312979 A1* | 10/2020 | Siemieniec | H01L 29/7805 |
| 2020/0319345 A1* | 10/2020 | Cheng | G01S 17/26 |
| 2020/0373313 A1* | 11/2020 | Tsukamoto | H01L 27/11507 |
| 2021/0005653 A1* | 1/2021 | Jang | H01L 27/14605 |
| 2021/0013310 A1* | 1/2021 | Leendertz | H01L 29/66734 |
| 2021/0043636 A1* | 2/2021 | Tsukamoto | G11C 11/223 |
| 2021/0060855 A1* | 3/2021 | Bendjus | B29C 64/393 |
| 2021/0066529 A1* | 3/2021 | Lu | H01L 27/1461 |
| 2021/0111032 A1* | 4/2021 | Cheng | H01L 29/66818 |
| 2021/0265403 A1* | 8/2021 | Lee | H01L 29/0638 |
| 2022/0052164 A1* | 2/2022 | Haase | H01L 29/0696 |

* cited by examiner

METHOD OF IMPLANTING AN IMPLANT SPECIES INTO A SUBSTRATE AT DIFFERENT DEPTHS

TECHNICAL FIELD

The disclosure relates to the field of lithography and implantation, and in particular to achieving different implant depths on defined areas in a substrate.

BACKGROUND

Some devices require different implant depths of an implant species in defined implant areas of the device. This typically involves multistep lithography, i.e. performing a first implant area lithography using a first temporary resist and a first implant energy, removing the first temporary resist, and then performing a second implant area lithography using a second resist and a second implant energy. Multistep lithography is expensive and inevitably results in indirect alignment of the implant areas due to the multistep lithography process involved. Hence, a more tolerant circuit design is needed which leads to a loss of device area and to a limitation of device performance.

Grey-tone lithography is an alternative approach to enable selective reduction of implant depth. Grey-tone lithography involves patterning the resist in the vertical dimension, i.e. modifying the resist thickness to obtain different implant depths. This approach avoids indirect alignment but suffers from a number of other problems, among them the lack of accuracy in vertical resist patterning.

SUMMARY

According to an aspect of the disclosure, a method of implanting an implant species into a substrate at different depths includes forming an implant mask over the substrate. The implant mask includes a first implant zone designed as an opening. The implant mask further includes a second implant zone designed as a block array. Further, the method includes implanting the implant species through the implant mask under an implant angle which is tilted against a block plane, such that a first implant area is formed by the implant species at a first depth in the substrate beneath the first implant zone and a second implant area is formed by the implant species at a second depth in the substrate beneath the second implant zone. The first depth is greater than the second depth.

According to a further aspect of the disclosure, a substrate includes a first implant area formed by an implant species at a first depth in the substrate. The substrate further includes a second implant area formed by the implant species at a second depth in the substrate. The second implant area has a wavy profile.

DETAILED DESCRIPTION

It is to be understood that the features of the various exemplary embodiments and examples described herein may be combined with each other, unless specifically noted otherwise.

Figure 1A:
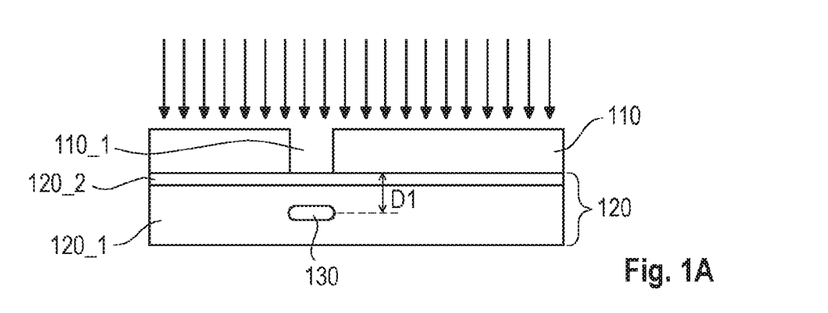
FIGS. 1A-1B are schematic illustrations of processes used in multistep lithography to obtain different implant depths in a substrate.
Figure 1B:
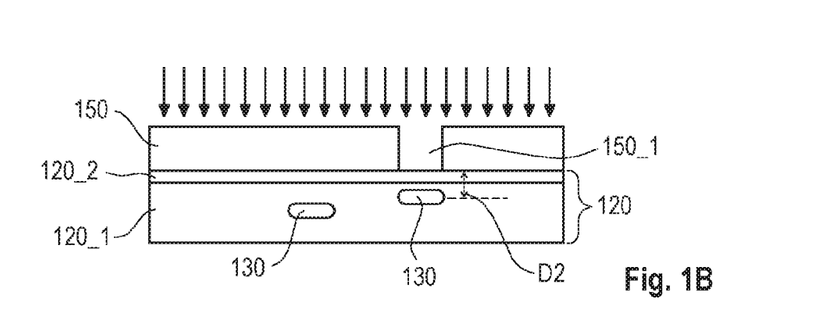

A conventional multistep lithography process to obtain different implant depths is illustrated in FIGS. 1A and 1B. Referring to FIG. 1A, a first implant mask 110 disposed over a substrate 120 is patterned by first lithography using a first reticle (not shown) to define a first opening 110_1 in the first implant mask 110. A high energy first implant indicated by arrows is done to locate an implant species 130 at a first implant depth D1 in the substrate 120. The substrate 120 may, e.g., comprise or be made of a semiconductor material layer 120_1 and a hard passivation layer 120_2.

The first implant mask 110 (e.g. a photoresist) is then removed and a second implant mask 150 (e.g. a photoresist) is disposed over the substrate 120. The second implant mask 150 is patterned by second lithography using a second reticle (not shown) to define a second opening 150_1. A lower energy second implant indicated by arrows in FIG. 1B (which are shorter than the arrows in FIG. 1A to indicate the lower implant energy) is done to locate the implant species 130 at a second implant depth D2 in the substrate 120, with D2<D1. Subsequently, the second implant mask 150 is removed (not shown in FIG. 1B).

A high number of process steps is needed for obtaining the different implant depths D1, D2, making the overall process costly. Costs for reticles and metrology inline controls are double. Further, the two (or more) lithography steps can only get aligned indirectly, which results in the need of trading off substrate area and device performance.

Figure 2:
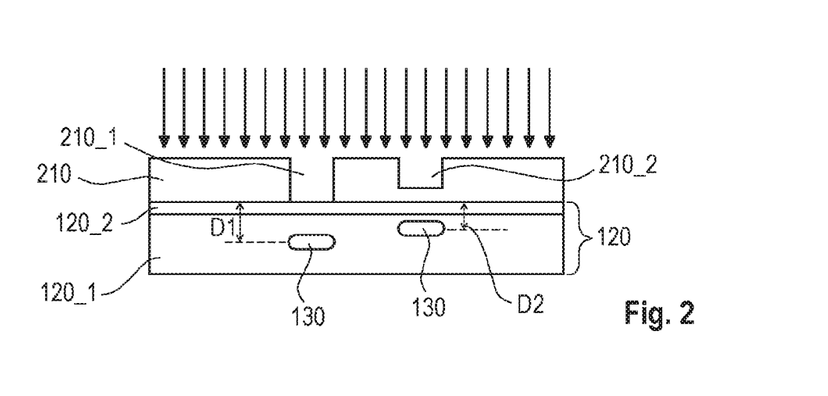
FIG. 2 is a schematic illustration of a process used in grey-tone lithography to obtain different implant depths in a substrate.
Figure 3:
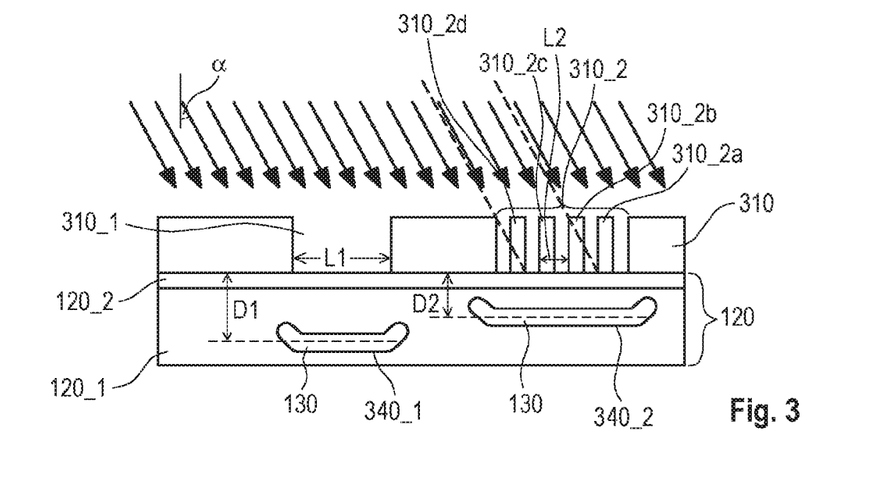
FIG. 3 is a schematic illustration of an exemplary process using a tilted implantation and an implant mask including a block array to obtain different implant depths in a substrate.

FIG. 2 illustrates an alternative approach to end up at two different implant depths D1 and D2 of an implant species 130 in a substrate 120. The process illustrated in FIG. 2 uses grey-tone lithography. Grey-tone lithography relies on varying the thickness of the implant mask (e.g. the resist thickness) while keeping implant energy constant. More specifically, grey-tone zones on the reticle are used to create an area 210_2 of reduced thickness of an implant mask 210 (which otherwise corresponds to implant mask 110 in FIG. 1A). A single high energy implant process indicated by arrows in FIG. 2 is then performed to locate the implant species 130 at the first implant depth D1 through an implant mask opening 210_1 (which corresponds to the first opening 110_1 in FIG. 1A) and at the second implant depth D2 through the area 210_2 of reduced implant mask thickness. Referring to FIG. 3 an exemplary approach to end up at different implantation depths D1, D2 involves that an implant mask 310 is formed over the substrate 120. The implant mask 310 includes a firsts implant zone 310_1 designed as an opening. The first implant zone 310_1, which corresponds to implant mask opening 210_1 in FIG. 2, has a first lateral dimension L1.

The implant mask 310 further includes a second implant zone 310_2 designed as a block array. The block array comprises a number of blocks 310_2a, 310_2b, 310_2c, 310_2d. The blocks 310_2a, 310_2b, 310_2c, 310_2d may all have an equal lateral dimension (block width). The blocks 310_2a, 310_2b, 310_2c, 310_2d may be arranged relative to each other under a block pitch of a second lateral dimension 12. The first lateral dimension 11 may, e.g., be greater than the second lateral dimension 12, i.e. L1>L2.

The first lateral dimension L1 may, e.g., be a minimum lateral dimension of the opening of the first implant mask zone 310_1 in a direction perpendicular to a block plane which is perpendicular to the first lateral dimension L1. That is, the opening may, e.g., be equal to or wider than L1 along other cross sections perpendicular to the block plane.

The blocks 310_2a, 310_2b, 310_2c, 310_2d may have a height equal to the thickness of the implant mask 310. More specifically, the implant mask 310 may have a constant thickness, or, if e.g. substrate topology is covered by the implant mask 310, an upper surface of the implant mask 310 adjacent the first implant zone 3101 may level with an upper surface of the blocks 310_2a, 310_2b, 310_2c, 310_2d of the block array.

The block array may include a number of M blocks 310_2a, 310_2b, 310_2c, 310_2d, . . . , with M equal to or greater than, e.g., 2, 5, 10, 20, 50, 100, 200, or 500.

Accordingly, the block array may have a lateral dimension in a direction perpendicular to the block plane (i.e. parallel to L1 and L2) which may be (much) larger than L2, e.g. equal to or larger than M times L2 (L2 is the block pitch). For example, the lateral dimension of the block array may be of the same order than L1.

In general, the blocks could have an equal length (in a dimension along the block plane) or could have different lengths. The length of a block could be equal to or greater than, e.g., 1, 2, 5, 10, 20, 50, 100, 200, or 500 times the width of the block. That is, the blocks may either be designed as lamellas, wherein a block may be termed a lamella if the length of the block is, e.g., equal to or greater than 2, 5, 10, 20, 50, 100, 200, or 500 times the width of the block. Many of the examples disclosed further below exemplify block arrays as lamella arrays. However, the blocks may also be designed as blocks with similar or equal dimensions in length and width, e.g. may even be shaped as squares, see the examples shown in FIGS. 8A-8D. Further, multiple block arrays could be combined (e.g. grouped or interlaced with one another) to form a (composite) block array. Such (composite) block array could be designed as a segmented block array, a serrated or staggered block array or may form any other pattern of composed or superimposed block arrays (FIGS. 8A-8D illustrate a few possible examples of such "irregular" types of block arrays).

The implant species 130 is implanted through the implant mask 310 into the substrate 120 under an implant angle α tilted against the block plane, see FIG. 3. The implant angle α is different from 0°. The implant angle α is chosen such that the implant species 130 has to pass through less implant mask material in the second implant zone 310_2 than in non-structured regions of the implant mask 310, even though the (bulk) thickness of the block-structured second implant zone 310_2 and the thickness of the implant mask 310 (in non-structured regions) may be the same.

Differently put, the combination of a tilted implant with areas of a segmented implant mask structure (as, e.g., represented by the second implant zone 310_2 of the implant mask 310) causes the implant species 130 (e.g. a dopant such as boron, indium, etc. for p-type doping and/or phosphorus, arsenic, antimony, etc. for n-type doping) to be closer to the surface of the substrate 120 than under large implant mask openings such as, e.g., represented by the first implant zone 310_1. Stated differently, the patterning of the second implant zone 310_2 in the implant mask 310 acts like a "sub-resolution pattern" for a tilted implant or a series of tilted implants.

As a consequence, the implant species 130 implanted through the first implant zone 3101 of the implant mask 310 is located at a first depth D1 which is greater than the second depth D2 at which the implant species 130 implanted through the second implant zone 310_2 is located. Non-structured regions of the implant mask 310 may completely shield the substrate 120 from the implant species 130, i.e. may act as blocking zones of the implant mask 310.

More specifically, when implanting the implant species 130 through the first and second implant zones 310_1, 310_2, the implant species 130 is located in the substrate 120 with a specific distribution in depth. A first implant area 340_1 associated with the first implant zone 310_1 and a second implant area 340_2 associated with the second implant zone 310_2 may both be defined as areas in the substrate 120 having an implant species concentration above a certain (absolute or relative) threshold. The first and second implant depths D1, D2 may then, e.g., be defined geometrically based on the shape of the respective implant areas 340_1, 340_2 (e.g. corresponding to the centerlines thereof) or based on the implant species 130 concentrations (e.g. D1 and D2 may correspond to the depths of maximum implant species concentration in the first and second implant areas 340_1, 340_2, respectively).

Comparing FIGS. 2 and 3, the block array approach combined with tilted implant (FIG. 3) may have the same effect as using an area of reduced implant mask thickness 210_2 in the grey-tone lithography approach of FIG. 2. Similar to the grey-tone lithography approach, the multiple depths D1, D2 may be obtained by using a single implant mask 310.

The first implant area 340_1 in the substrate 120 defined by the implant species 130 embedded in the substrate 120 through the first implant zone 310_1 of the implant mask 310 may have bent-up edges. Similarly, the second implant area 340_2 in the substrate 120 defined by the implant species 130 embedded in the substrate 120 through the second implant zone 310 of the implant mask 310 may have bent-up edges. The bent-up edges are caused by the tilted implantation which results in that implant species 130 which hit the implant mask 310 in the vicinity of the edges of the first or second implant zones 310_1, 310_2 pass through different lengths of implant mask material (e.g. photoresist material) depending on the implant angle and the distance from the edge of the respective first or second implant zone 310_1, 310_2.

While in FIG. 3 the tilted implantation is inclined against the vertical direction under the implant angle α, a further implant process may be performed through the implant mask 310 under the negative implant) angle, i.e. under the implant angle −α (not shown, the substrate 120 may be rotated by 180° to set the implant angle −α). Alternatively or in addition, further implant process(es) may be performed through the implant mask 310 under implant angle(s) different from α and/or −α.

The semiconductor material layer 120_1 of the substrate 120 may comprise or be of a bulk semiconductor material, e.g. Si, SiC, SiGe, GaAs, GaN, AlGaN, InGaAs, InAlAs, etc. The (optional) hard passivation layer 120_2 of the substrate 120 may comprise or be of an electrically insulating dielectric material, e.g. silicon oxide, silicon nitride, etc.

Figure 4A:
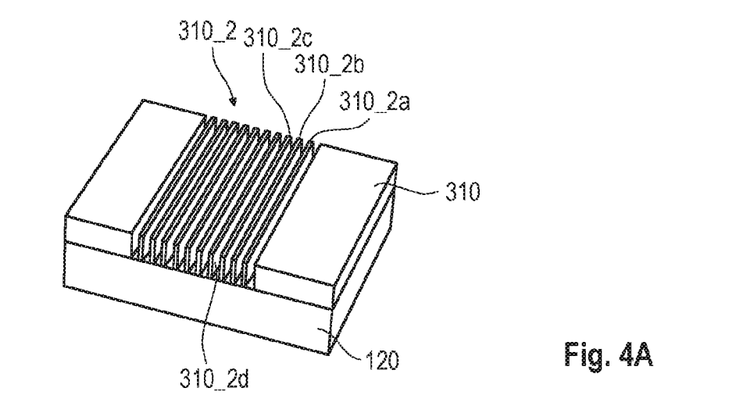
FIG. 4A is a perspective view of an exemplary implant mask block array disposed over a substrate.
Figure 4B:
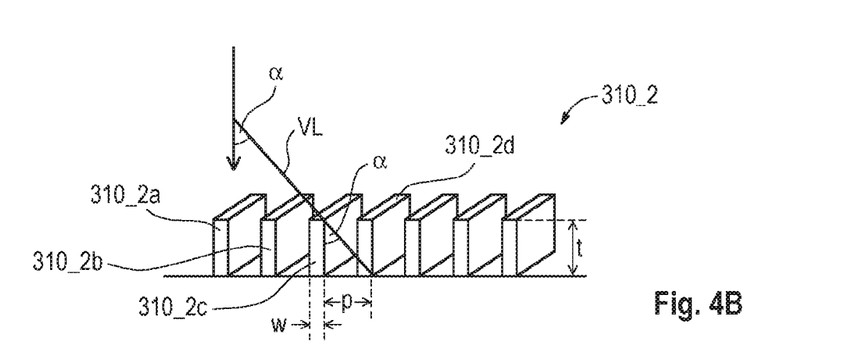
FIG. 4B is a perspective view of an exemplary implant mask block array.

FIG. 4A illustrates a perspective view of an exemplary second implant zone 310_2 of an implant mask 310 disposed over the substrate 120. As shown in FIG. 4A, the block array may be formed by a number of linear, parallel blocks 310_2a, 310_2b, 310_2c, 310_2d, . . . , which are, e.g., lamella-shaped in FIG. 4A. FIG. 4B illustrates another perspective view of the exemplary second implant zone 310_2 of the implant mask 310.

In general, the blocks 310_2a, 310_2b, 310_2c, 310_2d, need not to be linear (or straight). It is also possible that the blocks (e.g. lamellas) 310_2a, 310_2b, 310_2c, 310_2d, have a bent or curved shape (but may still have the other features described above such as, e.g., a constant pitch p, a constant height, a constant width w etc.).

In general, however, the pitch p of the blocks 310_2a, 310_2b, 310_2c, 310_2d, . . . and/or the width w of the blocks 310_2a, 310_2b, 310_2c, 310_2d, . . . need not to be the same. Rather, it is possible that the pitch p and/or the width w of the blocks 310_2a, 310_2b, 310_2c, 310_2d, . . . may have multiple certain values and/or may gradually change. This, e.g., would allow to create a second implant area 340_2 where the implant species 130 (e.g. dopant) is located at multiple certain depths and/or is located at a gradually changing depth.

The implant process can be tailored in multiple ways, e.g. by varying the implant mask thickness t, the pitch p (also referred to as L1 in FIG. 3) of the blocks 310_2a, 310_2b, 310_2c, 310_2d, the implant angle α and the block width w. As illustrated in FIG. 4B, the implant angle α may be chosen to match the pitch p and the aspect ratio t/(p−w) of the blocks 310_2a, 310_2b, 310_2c, 310_2d. More specifically, a virtual line VL parallel to the implant direction may "touch" e.g. the upper right corner of a block (here: block 310_2c) and then pass through the neighboring block (here: block 310_2d) and leave this block at the lower right foot edge.

This relationship of dimensioning the block array and setting the implant angle results in that each implant species 130 always passes through the same amount of implant mask (e.g. resist) material irrespective of where it hits the block array within the second implant zone 310_2 of the implant mask 310. Thus, the second implant area 340_2 formed in the substrate 120 by the embedded implant species 130 should ideally have a straight or linear shape (except of the bent-up edges). However, as described further below, the second implant area 340 will have a slightly wavy profile due to unavoidable "non-ideality", e.g. tolerances (variations in width w and/or height t and/or irregularities in pitch p) in the geometry of the block array and/or deviations from the desired implant angle and/or aberrations from implant parallelism, etc.

As depicted in FIG. 4B, an optimum implant angle may be written as α=arctan(p/t). More generally, the implant angle α may, e.g., be within the ranges of arctan(p/t)±15°, arctan(p/t)±10°, arctan(p/t)±5°, or arctan(p/t)±2°.

Further, while in the example shown in FIG. 4B the virtual line VL runs only through one block (here: block 310_2d), it is also possible that the virtual line VL intersects with multiple blocks 310_2a, 310_2b, 310_2c, 310_2d. If N blocks are intersected, the optimum implant angle may be written as α=arctan(Np/t). The implant angle α may then be within the ranges of arctan(Np/t)±15°, arctan(Np/t)±10°, arctan(Np/t)±5°, or arctan(Np/t)±2°, with N being an integer equal to or greater than 1.

Generally, the implant angle α may, e.g., be between 5° and 45°, or 10° and 40°, or 15° and 35°, or 20° and 30°. The block pitch p may, e.g., be equal to or less than 20 μm, 10 μm, 5 μm, 2 μm, 1.5 μm, 1.2 μm, 1.0 μm, 0.8 μm, 0.6 μm, 0.4 μm, 0.2 μm, 0.1 μm or 80 μm. The thickness t of the implant mask 310 may, e.g., be equal to or greater than 0.1 μm, 0.2 μm, 0.5 μm, 1.0 μm, 1.5 μm, 2.0 μm, 2.5 μm, 3.0 μm, 3.5 μm, 5.0 μm, 10 μm, or 20 μm. All these quantities may be combined. The combinations may, e.g., be in accordance with the relationship between implant angle and implant mask geometry as described above.

Figure 5:
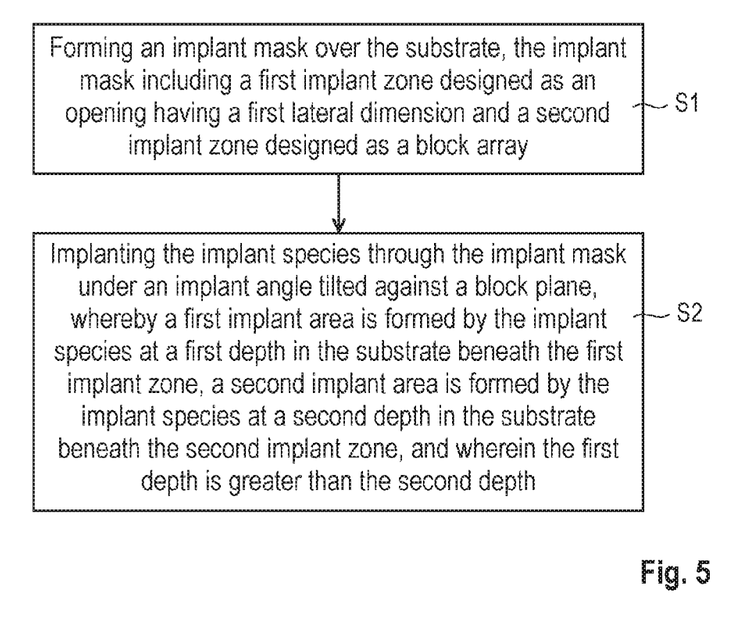
FIG. 5 is a flowchart schematically illustrating an exemplary method of implanting an implant species into a substrate at different depths.

Referring to FIG. 5, a method of implanting an implant species into a substrate at different depths may comprise, at S1, forming an implant mask over the substrate, wherein the implant mask includes a first implant zone designed as an opening having a first lateral dimension, and a second implant zone designed as a block array. For instance, the block array may have a block pitch of a second lateral dimension, wherein the first lateral dimension is greater than the second lateral dimension. The formation of the implant mask at S1 can be done by standard resist lateral patterning tools, materials and processes which have been developed and optimized through decades of technological progress in the field of lithography.

At S2, the implant species is implanted through the implant mask under an implant angle tilted against a block plane. Thereby a first implant area is formed by the implant species at a first depth in the substrate beneath the first implant zone and a second implant area is formed by the implant species at a second depth in the substrate beneath the second implant zone, wherein the first depth is greater than the second depth. As many of the existing implant tools already allow for a tilted implant, S2 will typically not incur any additional cost to existing wafer processing methods or tools.

Generally, the process described herein may be modified in a variety of ways. For instance, the same implant mask may be used for a second (or further) implant having different implant energy and/or different implant angles and/or different implant species 130 (dopant). For instance, two or more tilted implants from the left and/or right side may be performed. Further, the whole process S1, S2 could be done more than once. For instance, after S1 and S2 the implant mask may be removed, another implant mask including another block array could be applied and the process of S1, S2 may be repeated with the other implant mask using different implant energy and/or different implant angles and/or different implant species 130 (dopant).

If compared to grey-tone lithography, a reticle to print small blocks is less expensive than a reticle with sub-resolution grey-tone patterns for vertical resist patterning.

While for grey-tone lithography only a limited subset of photoresist materials is suited, the approach described herein may use a wide range of mask materials (i.e. a wider range of photoresists or other materials configured for shielding the substrate from the implant species 130). The critical dimensions (CD) of the blocks in the photoresists are much easier and much more accurate to control than grey-tone modulated resist thickness. Additionally, a run-to-run control of the critical dimensions (e.g. pitch, aspect ratio, width, height) of blocks can easily be done, while a run-to-run control on grey-tone resist thickness is difficult to implement. In short, the "tilted implant—block array" approach described herein provides for many advantages if compared to conventional grey-tone lithography technology.

Figure 6:
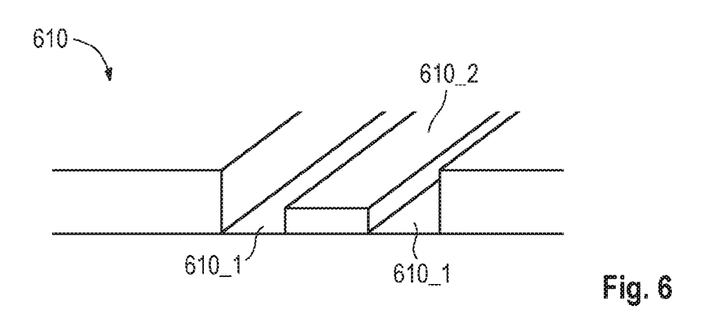
FIG. 6 is a perspective view of an implant mask used in grey-tone lithography to obtain an implant area in a substrate at reduced implant depth.
Figure 7:
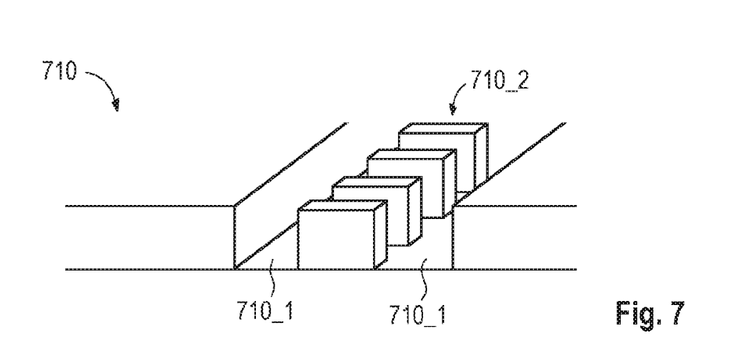
FIG. 7 is a perspective view of an implant mask including a block array to obtain an implant area in a substrate at a reduced implant depth corresponding to the reduced implant depth in FIG. 6.

FIGS. 6 and 7 illustrate the equivalence of existing grey-tone lithography (combined with vertical implant) and the block array approach combined with tilted implant relative to the vertical direction. The implant mask 610 (e.g. structured resist) of FIG. 6 includes an area of reduced implant mask thickness 610_2 which is laterally bounded by two implant mask openings 610_1. The area of reduced implant mask thickness 610_2 may be bar-shaped. This kind of grey-tone pattern translates into the implant mask 710 shown in FIG. 7. The implant mask 710 (e.g. structured resist) includes a second implant zone 710_2 designed as an block array which is laterally bounded by two first implant zones 710_1 designed as longitudinal openings in the implant mask 710. The footprint of the block array of implant mask 710 may coincide with the footprint of the area of reduced implant mask thickness 610_2. Further, the implant mask openings 710_1 may correspond in shape with the implant mask openings 610_1. It is to be noted that the thickness of the second implant zone 610_2 in FIG. 6 translates in a specific relationship between the implant angle α, the width w and the pitch p of the block array for a given thickness t (i.e. block height) of the implant mask 710.

Figure 8A:
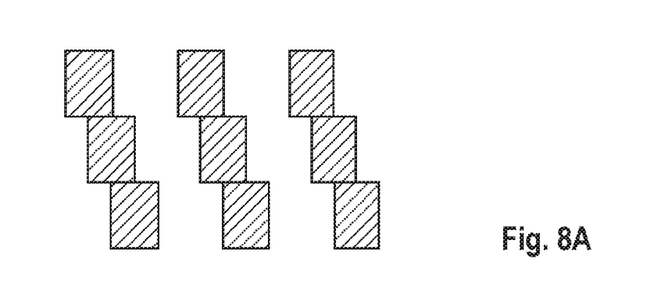
FIGS. 8A-8D are top views on various implant masks including block arrays of different patterns.
Figure 8B:
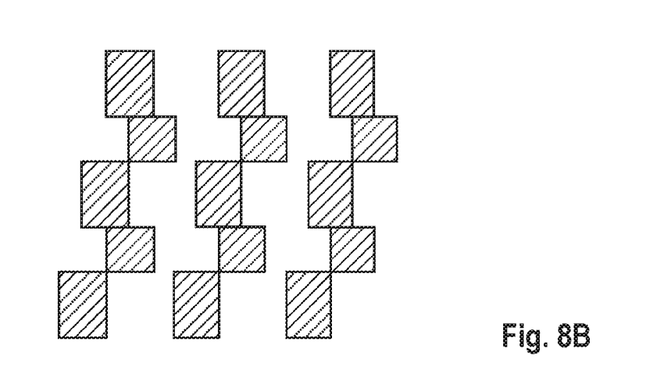
Figure 8C:
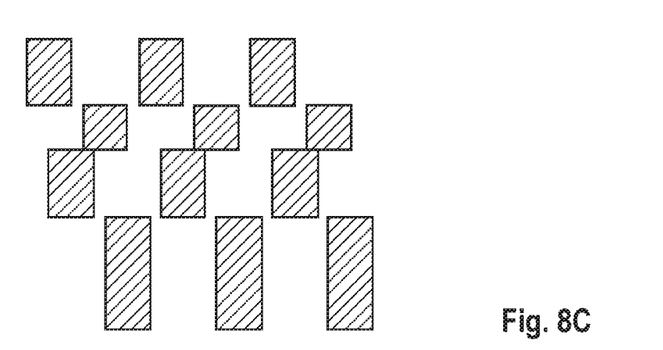
Figure 8D:
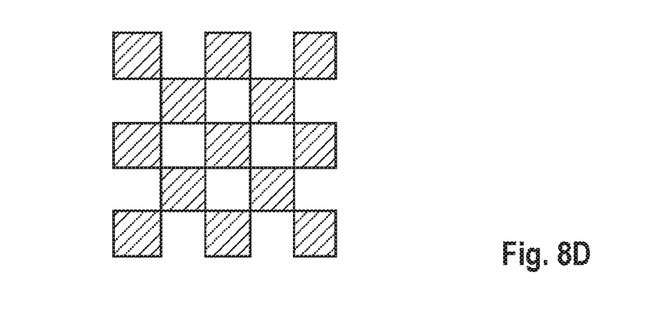

FIGS. 8A-8D illustrate top views on various "irregular" implant masks including block arrays of different patterns, i.e. on implant masks which are not formed by a regular lamella array. Instead, FIG. 8A illustrates a block array formed by lamella segments which form a staggered arrangement, i.e. the lamella segments are aligned offset to one another relative to the lateral dimension. FIG. 8B illustrates a block array composed of patterns of different block shapes, e.g. squares and rectangles (lamellas). Again, the blocks may be aligned in a staggered arrangement. FIG. 8C illustrates a block array also composed of patterns of different block shapes, wherein the blocks are (at least partly) separated from each other. FIG. 8D illustrates a block array in checkerboard pattern. Further, many other examples of "irregular" block arrays are feasible. As apparent from FIGS. 8A-8D, these examples may still use a constant pitch and/or a constant width. All these examples provide for similar shallow implant profiles as "regular" block array or lamella array, except that the implant profile could be slightly affected due to known lithographic line end shortening effects, i.e. the resist image of the end of small blocks or lamellas can get slightly rounded, which as a consequence will locally have some impact on the implant profile. It is to be noted that any of the above implant mask pattern features could be combined selectively or in aggregation with any of the features disclosed elsewhere in this application.

Figure 9:
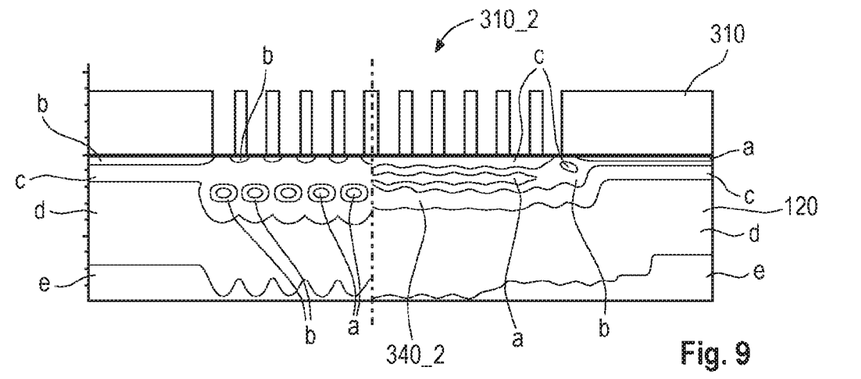
FIG. 9 is an illustration of simulation results showing implant profiles obtained by implanting the implant species through the implant mask block array in a direction parallel to a block plane (left side portion) and under an angle tilted against the block plane (right side portion).

FIG. 9 illustrates implant profiles (in terms of areas of different implant species concentrations) obtained by computation which simulates the implanting of the implant species 130 through a block array in a direction parallel to the block plane (left portion from the dash-dotted line in FIG. 9) and under an angle tilted against the block plane (right portion from the dash-dotted line in FIG. 9). The simulation was performed for the example of p=0.8 µm, w=0.3 µm (i.e. the spacing between the blocks is 0.5 µm), a photoresist with t=1.5 µm and a tilted boron implant. An implant angle α=25° was used, wherein the implant angle α was oriented perpendicular to the block plane in the right side portion of FIG. 9 and was oriented along the block plane in the left side portion of FIG. 9. The tilted implant was done twice, i.e. a first tilted implant at implant angle α was performed, the substrate 120 was rotated by 180° and then the tilted implant was performed again (now under an implant angle −α due to the rotation of the substrate 120).

Exemplary implant profiles are indicated in FIG. 9 by exemplary implant areas of different concentrations of the implant species. Ranges of different concentrations are illustrated by letters a, b, c, d, e, with
a=$1.1 \times 10^{17}$ cm$^{-3}$ to $2.8 \times 10^{18}$ cm$^{-3}$,
b=$4.3 \times 10^{15}$ cm$^{-3}$ to $1.1 \times 10^{17}$ cm$^{-3}$,
c=$1.7 \times 10^{14}$ cm$^{-3}$ to $4.3 \times 10^{15}$ cm$^{-3}$,
d=$2.6 \times 10^{11}$ cm$^{-3}$ to $1.7 \times 10^{14}$ cm$^{-3}$,
e=below $2.6 \times 10^{11}$ cm$^{-3}$.

As apparent from FIG. 9, the implant profile in the right side portion of FIG. 9 (where the blocks are hit under α=25°) is less deep than the implant profile in the left side portion of FIG. 9 (where only the top portions of the blocks but not the sidewalls of the blocks are hit by the implant species). Further, while the left side portion of FIG. 9 illustrates that the high concentration implant profile at a, b is shaped as a series of disconnected implant areas located between the blocks, the high concentration implant profile at a, b in the right side portion of FIG. 9 is a continuous, slightly wavy area located at a smaller distance under the surface of the substrate 120. The waviness of the profile is caused by the block structure and therefore provides clear evidence of the way the reduced implant depth in the second implant area 340_2 (which is defined by the implant species 130 embedded in the substrate 120 through the second implant zone 310_2, 710_2 of the implant mask 310, 710) has been created. Though the waviness could be avoided in theory, it will show up in all practical embodiments either due to geometrical tolerances and/or irregularities or other causes or even as a desired implant feature.

Figure 10:
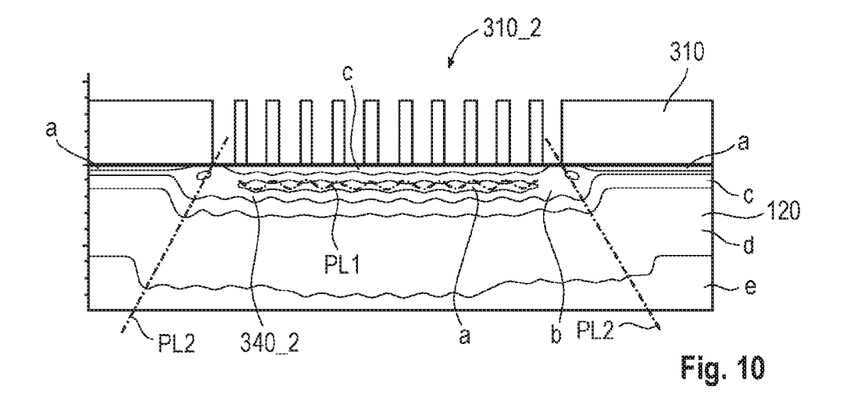
FIG. 10 is an illustration of simulation results showing the implant profile obtained by implanting the implant species through the implant mask block array under an angle tilted against the block plane.

FIG. 10 illustrates an implant profile (again in terms of areas of different implant species concentrations) obtained the same way as in the right portion of FIG. 9, i.e. by implanting the implant species 130 through a block array under an angle tilted against the block plane. The wavy profile of the shallow implant at around depth D2 (e.g. along the highest concentration area a) is shown by phantom line PL1 for ease of representation.

The periodicity of the wavy profile (which may correspond to the block pitch) may be smaller than the first lateral dimension.

FIG. 10 illustrates by way of example that the second implant area 340_2 is shaped with bent-up edges, see for example the bent-up ends of the (high concentration) implant areas b.

The second implant area 340_2 has, e.g., a laterally expanding foothills zone of low implant concentration in downward direction, see phantom lines PL2. The laterally expanding foothills zone is caused by the tilted implant and therefore provides evidence of the way the reduced implant depth in the second implant area 340_2 (which has a significantly higher implant species concentration than the foothills zone) has been created.

Figure 11:
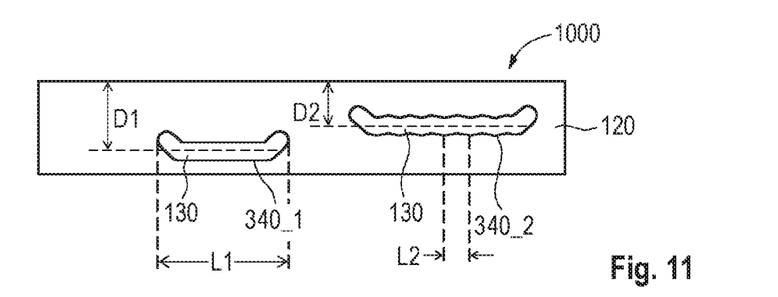
FIG. 11 is a schematic illustration of a device including a substrate having implant areas at different depths.

FIG. 11 schematically illustrates a device 1000 including a substrate 120 having at least a first implant area 340_1 and a second implant area 340_2 which are at different depths D1, D2, respectively. The first implant area 340_1 is formed by an implant species 130 at the first depth D1 in the substrate 120, the first implant area having a first lateral dimension L1' (which may be similar to L1 or a little be greater than L1 due to the tilted implant). The second implant area 340 is formed by the implant species 130 at a second depth D2 in the substrate 120. The first depth D1 is greater than the second depth D2. As already illustrated e.g. in FIGS. 8 and 9 for the high concentration implant species profiles a, b, the second implant area 340_2 has a wavy profile with a periodicity L2 smaller than the first lateral dimension.

Further, the second implant area 340_2 may be shaped with bent-up edges as, e.g., illustrated in FIGS. 3, 8, 9 and 10.

The second implant area 340_2 may have a laterally expanding foothills zone of declining implant species concentration in downward direction as illustrated in FIG. 10, see phantom lines PL2.

The devices 1000 may be implemented in a variety of different semiconductor devices. For instance, a LDMOS (lateral double-diffused metal oxide semiconductor) transistor may include the device 1000. Further, an ESD (electrostatic discharge) protection device may include the device 1000, wherein ESD robustness of an integrated circuit (IC) is significantly improved by the implant areas at different depths located under, e.g., the lightly doped drain and/or source structures in a semiconductor transistor (which may, e.g., be a nMOS device and the ESD implant area below the drain and/or source structures may be a n-type implantation). Still further, a wavelength-resolving optical sensor may include the device 1000, wherein the implant areas at different depths are used to resolve different wavelengths.

The following examples pertain to further aspects of the disclosure:

Example 1 is a method of implanting an implant species into a substrate at different depths, the method includes forming an implant mask over the substrate, the implant mask including a first implant zone designed as an opening, and a second implant zone designed as a block array; and implanting the implant species through the implant mask under an implant angle tilted against a block plane, whereby a first implant area is formed by the implant species at a first depth in the substrate beneath the first implant zone, a second implant area is formed by the implant species at a second depth in the substrate beneath the second implant zone, and the first depth is greater than the second depth.

In Example 2, the subject matter of Example 1 can optionally include wherein the opening has a first lateral dimension and the block array has a block pitch of a second lateral dimension, wherein the first lateral dimension is greater than the second lateral dimension.

In Example 3, the subject matter of Example 2 can optionally include wherein the first lateral dimension is a minimum lateral dimension of the opening in a direction perpendicular to the block plane.

In Example 4, the subject matter of any of the preceding Examples can optionally include wherein the implant mask is used as a single mask to obtain the different depths.

In Example 5, the subject matter of any of the preceding Examples can optionally include wherein the implant mask has a constant thickness and/or an upper surface of the implant mask adjacent the first implant zone levels with an upper surface of the blocks of the block array.

In Example 6, the subject matter of any of the preceding Examples can optionally further include implanting the implant species or another implant species through the implant mask under a different implant angle, in particular the negative implant angle, as used in the implanting before.

In Example 7, the subject matter of any of the preceding Examples can optionally further include implanting the implant species or another implant species with a different implant energy as used in the implanting before.

In Example 8, the subject matter of any of the preceding Examples can optionally include wherein the implant angle is between 5° and 45°, or 10° and 40°, or 15° and 35°, or 20° and 30°.

In Example 9, the subject matter of any of the preceding Examples can optionally include wherein the implant angle is within $\arctan(Np/t)\pm 15°$, $\arctan(Np/t)\pm 10°$, or $\arctan(Np/t)\pm 5°$, or $\arctan(Np/t)\pm 2°$, wherein t is the thickness of the implant mask, p is the block pitch and N is an integer equal to or greater than 1.

In Example 10, the subject matter of any of the preceding Examples can optionally include wherein the block pitch is equal to or less than 20 µm, 10 µm, 5 µm, 2 µm, 1.5 µm, 1.2 µm, 1.0 µm, 0.8 µm, 0.6 µm, 0.4 µm, 0.2 µm, 0.1 µm, or 80 µm.

In Example 11, the subject matter of any of the preceding Examples can optionally include wherein the thickness of the implant mask is equal to or greater than 0.1 µm, 0.2 µm, 0.5 µm, 1.0 µm, 1.5 µm, 2.0 µm, 2.5 µm, 3.0 µm, 3.5 µm, 5.0 µm, 10 µm, or 20 µm.

Example 12 is a substrate having implant areas at different depths, including a first implant area formed by an implant species at a first depth in the substrate, a second implant area formed by the implant species at a second depth in the substrate, wherein the first depth is greater than the second depth and the second implant area has a wavy profile.

In Example 13, the subject matter of Example 12 can optionally include wherein the first implant area has a first lateral dimension and the wavy profile has a periodicity smaller than the first lateral dimension.

In Example 14, the subject matter of Example 12 or 13 can optionally include wherein the second implant area is shaped with bent-up edges.

In Example 15, the subject matter of any one of Examples 12 to 14 can optionally include wherein the second implant area has a laterally expanding foothills zone of low implant concentration in downward direction.

While this invention has been described with reference to illustrative embodiments, this description is not intended to be construed in a limiting sense. Various modifications and combinations of the illustrative embodiments, as well as other embodiments of the invention, will be apparent to persons skilled in the art upon reference to the description. It is therefore intended that the appended claims encompass any such modifications or embodiments.

What is claimed is:

1. A method of implanting an implant species into a substrate at different depths, the method comprising:
   forming an implant mask over the substrate, the implant mask including a first implant zone designed as an opening and a second implant zone designed as a block array; and
   implanting the implant species through the implant mask under an implant angle tilted against a block plane, such that a first implant area is formed by the implant species at a first depth in the substrate beneath the first implant zone and a second implant area is formed by the implant species at a second depth in the substrate beneath the second implant zone, the first depth being greater than the second depth, wherein the opening of the first implant zone has a first lateral dimension, wherein the block array comprises a plurality of blocks arranged relative to each other under a block pitch of a second lateral dimension less than the first lateral dimension, wherein the implant angle is chosen such that the implant species passes through a same amount of implant mask material irrespective of where the implant species hits the block array within the second implant zone of the implant mask, wherein a bulk thickness of the block array and a thickness of the implant mask in non-structured regions is the same.

2. The method of claim 1, wherein the first lateral dimension is a minimum lateral dimension of the opening in a direction perpendicular to the block plane.

3. The method of claim 1, wherein the implant mask is used as a single mask to obtain the different depths.

4. The method of claim 1, wherein an upper surface of the implant mask adjacent the first implant zone is level with an upper surface of blocks of the block array.

5. The method of claim 1, further comprising:
implanting the implant species or another implant species through the implant mask under a different implant angle.

6. The method of claim 5, wherein the different implant angle is the negative of the implant angle used in the prior implanting.

7. The method of claim 1, further comprising:
implanting the implant species or another implant species with a different implant energy as used in the prior implanting.

8. The method of claim 1, wherein the implant angle is between 5° and 45°, or 10° and 40°, or 15° and 35°, or 20° and 30°.

9. The method of claim 1, wherein the implant angle is within $\arctan(Np/t\pm15°)$, $\arctan(Np/t\pm10°)$, or $\arctan(Np/t\pm5°)$, or $\arctan(Np/t\pm2°)$, wherein t is the thickness of the implant mask, p is the block pitch of the block array and N is an integer equal to or greater than 1.

10. The method of claim 1, wherein the block pitch of the block array is equal to or less than 20 μm, 10 μm, 5 μm, 2 μm, 1.5 μm, 1.2 μm, 1.0 μm, 0.8 μm, 0.6 μm, 0.4 μm, 0.2 μm, 0.1 μm, or 80 nm.

11. The method of claim 1, wherein the thickness of the implant mask is equal to or greater than 0.1 μm, 0.2 μm, 0.5 μm, 1.0 μm, 1.5 μm, 2.0 μm, 2.5 μm, 3.0 μm, 3.5 μm, 5.0 μm, 10 μm, or 20 μm.

12. The method of claim 1, wherein the implant mask is a photoresist.

13. The method of claim 12, further comprising:
patterning the photoresist by lithography to form the first implant zone and the second implant zone.

14. The method of claim 1, wherein the implant mask is completely removed from the substrate between blocks of the block array.

15. The method of claim 1, wherein the first implant area and the second implant area are located at different depths under a lightly doped drain and/or a source structure of a semiconductor transistor.

16. The method of claim 15, wherein the semiconductor transistor is a nMOS device, and wherein the first implant area and the second implant area are n-type ESD implant areas.

* * * * *

UNITED STATES PATENT AND TRADEMARK OFFICE
CERTIFICATE OF CORRECTION

PATENT NO. : 11,640,908 B2
APPLICATION NO. : 16/877855
DATED : May 2, 2023
INVENTOR(S) : J. Ortner et al.

It is certified that error appears in the above-identified patent and that said Letters Patent is hereby corrected as shown below:

On the Title Page

Item (56) U.S. Patent Documents, page 2, Column 1, Line 27, please change "Sailing" to -- Salling --

In the Claims

Column 12, Line 5 (Claim 9, Line 2) please change "arctan(Np/t±15°)," to -- arctan(Np/t)±15°, --
Column 12, Line 5 (Claim 9, Line 2) please change "arctan(Np/t±10°)," to -- arctan(Np/t)±10°, --
Column 12, Lines 5-6 (Claim 9, Lines 2-3) please change "arctan(Np/t±5°)," to -- arctan(Np/t)±5°, --
Column 12, Line 6 (Claim 9, Line 3) please change "arctan(Np/t±2°)," to -- arctan(Np/t)±2°, --

Signed and Sealed this
Eighteenth Day of July, 2023

Katherine Kelly Vidal
*Director of the United States Patent and Trademark Office*